INTEGRATED CIRCUIT MATRIX HAVING PARALLEL CIRCUIT STRIPS

Filed May 29, 1968

BY George V. Eltgroth and Joseph B. Forman
ATTORNEYS FOR INVENTORS
Franco FORLANI
Giorgio SACCHI
Nicola MINNAJA United States Patent Office 3,555,365
Patented Jan. 12, 1971

3,555,365

INTEGRATED CIRCUIT MATRIX HAVING PARALLEL CIRCUIT STRIPS

Franco Forlani and Nicola Minnaja, Rho, Milan, and Giorgio Sacchi, Como, Italy, assignors to General Electric Information Systems, Italia S.p.A., Caluso, Torino, Italy, a corporation of Italy Filed May 29, 1968, Ser. No. 732,988
Claims priority, application Italy, May 30, 1967, 16,644
Int. Cl. H01l *19/00*
U.S. Cl. 317—101 8 Claims

ABSTRACT OF THE DISCLOSURE

The invention relates to memories which may be mass formed as integrated circuits by suitable deposition of predetermined materials on a substrate and wherein memories having determined characteristics may be formed by selectively electrically destroying predetermined electrical links.

The present invention relates generally to integrated assemblies of circuit elements obtained by deposition of predetermined materials on a suitable substrate, and, more specifically, to a surface barrier diode matrix suitable for providing a fixed memory device for data processing apparatus.

A large number of integrated circuit assemblies and the various methods for obtaining the same are well known in the art.

In such assemblies, generally formed on a single chip of semiconductor, the active devices and the conductors are formed on the same face of the semiconductor. If multilayer connections are desired, the growth of one or more insulating layers is necessary since the connecting conductors must be insulated from each other at each crossing point, thus causing an increase in manufacturing cost and a diminution in operational reliability.

It is an object of the present invention to provide an integrated assembly of circuit elements deposited on a face of a plane substrate using both faces of the substrate for access to the circuit elements.

It is a more specific object of the invention to provide a surface barrier diode matrix having outstanding advantages with respect to economy of manufacture and reliability of operation.

Yet another object of the invention is to provide a method for obtaining a read-only, high speed, diode memory device, wherein the storing of the fixed innformation is accomplished by a simple operation which may be readily automated.

The foregoing objects are attained, according to the invention, by employing a plane semiconductor substrate suitably doped, on one face of which the circuit elements, an insulating layer, and a part of the access conductors, are deposited, and the remaining part of the access conductors are deposited on the other face of the said substrate, and furthermore subdividing the substrate into spatially separated portions, held together by portions of the access conductors which are sufficiently sturdy and firmly adherent to the substrate.

In particular, the arrangement in a matrix array of circuit elements, for instance diodes, connected by a first set of column conductors and a second set of row conductors to form a read-only memory device, is obtained by providing spatially separated strips of the semiconductive substrate so that the row conductors are deposited on one face and the column conductors, which are of convenient thickness and firmly adherent to the opposite surface, hold the same firmly together thus providing both the electrical connection and the physical support of the assembly.

The invention also may be used for other circuit assemblies to form different electronic devices comprising linear and non-linear elements, as well as passive or active devices, such as bipolar transistors, field effect transistors, and others.

These and other features and advantages of the invention will become apparent from the detailed description of a preferred embodiment thereof, and from the accompanying drawings, wherein:

FIG. 1 is a perspective view of a portion of a diode matrix formed according to the invention.

FIG. 2 schematically represents the wiring diagram of a portion of the same.

Figure 1:
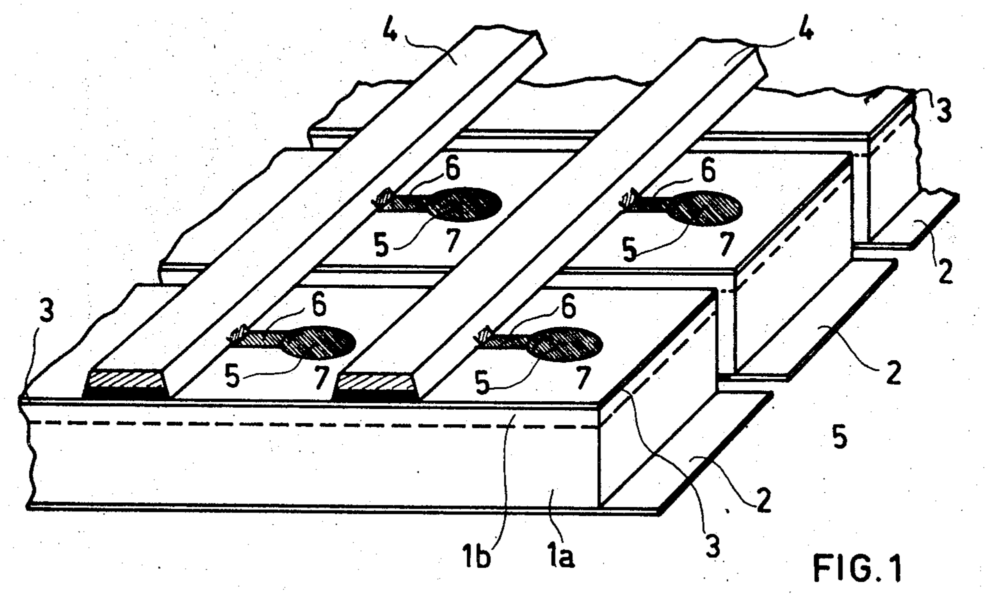

Referring to FIG. 1, the substrate 1 is a silicon plane slab conveniently doped in order to form an n-type semiconductor, comprising two layers, lower layer 1*a*, having a low resistivity, and upper layer 1*b*, epitaxially grown on the former, having a comparatively high resistivity. Such substrates are well known to those skilled in the art, and are commercially available in small plane slabs, usually called "chips," having the required geometrical, physical and electrical characteristics.

According to the invention, the slab is divided into parallel strips of equal width along one direction, which will be called "horizontal," separated by slits of substantially smaller width.

These strips are covered, on their lower surface, by a thin layer 2 of metal, preferably gold, which forms an ohmic contact with the underlying low resistivity semiconductor, therefore depriving the same of rectifying characteristics. The metallic strips 2 form the row conductors of the diode matrix.

The upper surfaces of the silicon strips are covered by a thin insulating layer 3 of silicon dioxide, with the exception of a small area, distributed along each strip for equal distances, wherein the layer of silicon dioxide has been removed, and small portions of suitable metal, preferably gold, are deposited on the high resistivity layer of the substrate, thereby providing rectifying contacts of the type called "surface barrier rectifying contacts," well known in the art and described, for example, in the article "Metal-Semiconductor Surface Barriers" by C. A. Mead, published in "Solid State Electronics," vol. 9, 1966, pages 1023–1037.

In the resulting diodes, the gold is the anode, and the underlying semiconductor is the cathode. These diodes, also called Schottky diodes, are remarkable for their high recovery speed, due to the fact that the conduction is based on majority carriers and therefore the presence of minority carrier storage phenomena does not limit the operating speed. A plurality of gold bars 4 are deposited and grown to a suitable thickness on the insulating layer of silicon dioxide covering the upper surface. By a process which will be described hereafter, these bars are made to adhere firmly to the silicon dioxide. They extend in a direction substantially orthogonal to the direction of the semiconductor strips; such direction will be hereafter called "vertical."

Therefore the separated silicon strips are held together and maintained at fixed relative positions by said bars. In addition, the bars 4 fulfill the function of column conductors of the matrix.

Figure 2:
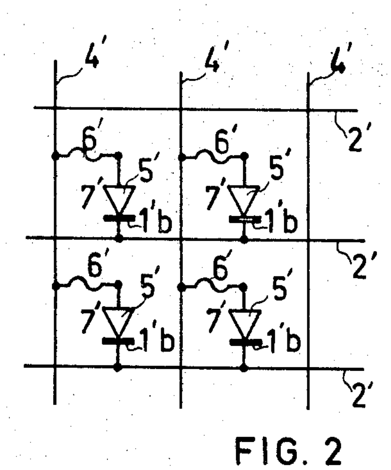

Thin short bridges 6 of a metal having a relatively high electrical resistivity connect each anode 5 of the diodes 7 to a bar 4. The metal used for these bridges may for instance be a nickel chromium alloy, such as the one known by the trade name Nichrome. The assembly, as described, is a complete diode matrix, wherein each diode unidirectionally connects a vertical bar 4 (column conductor) to a different horizontal conductive strip 2 (row conductor). The wiring diagram of the matrix is shown in FIG. 2, wherein the symbols of the components of FIG. 1 are designated by the same reference number provided with a prime designation.

From the complete diode matrix as described, an incomplete diode matrix, which can operate as a read-only memory, may be obtained by selectively isolating predetermined diodes from the bars 4, in which condition each column conductor is connected only to predetermined row conductors through the remaining nonisolated diodes. This is accomplished, for example, by connecting a selected bar 4 to a positive voltage source, and a different voltafge, preferably ground potential or a negative voltage source, to the row conductors to which the cathodes of the diodes to be isolated, are connected. The voltage difference between the selected bar 4 and the row conductors causes a current of sufficient intensity to melt the bridges 6, thereby interrupting the connection between bar 4 and the anodes of selected diodes.

Figure 3:
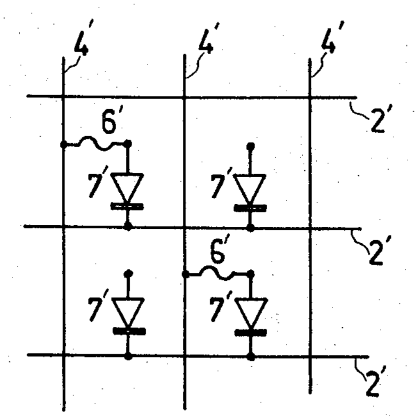
FIG. 3 is the wiring diagram of the same portion of the read-only memory obtained therefrom.

By performing this operation in succession on all bars 4, an incomplete dioed matrix, such as the one represented in FIG. 3, wherein only some predetermined bridges 6' remain, is obtained.

If now an input signal is applied to a selected column conductor, an output signal is obtained only on the row conductors which are connected to the column conductor through a bridge 6' and diode 7'.

Thus a read-only memory device, having a high speed of operation due to the intrinsic speed of operation of the diode devices and the reduced stray capacitance between elements of the circuit, is obtained.

The process to be used for obtaining the deposition of the horizontal strips 2, the separation of the semiconductor strips, the surface barrier diodes 7 and the insulating layer 3 of silicon dioxide, are substantially known in the techniques now very commonly used for fabricating integrated circuit assemblies and therefore will be only summarily described. Particular emphasis will be given to the sequence of the different operations.

In all cases, when material is to be deposited on or to be removed from selected areas, it is intended that any one of the generally known methods for such purposes may be used. One of such methods comprises, for example, covering the entire surface of the object with a photosensitive protecting lacquer (known as photoresist), then illuminating the lacquer with a convenient light source through a mask of a proper design, thereafter treating the lacquer which has been subjected to the light action, and thereafter exposing only well defined areas of the substrate to subsequent chemical or physical processing operations.

The process according to the invention comprises the folowing steps.

A plane slab of monocrystalline silicon of approximately 140 microns thickness, doped to have a low resistivity, i.e. 0.01 ohm cm., is covered with a high resistivity layer (1.5 ohm cm.) of approximately 10 microns thickness, epitaxially grown.

Both surfaces of the slab are covered with a very thin (1.5 microns) insulating layer of silicon dioxide, by the well known thermal oxidation process. On the epitaxially grown surface, which is for example the upper one, such layer is later removed at small circular areas, at which a thin layer of gold is deposited by evaporation, thus obtaining the surface barrier diodes.

Figure 4:
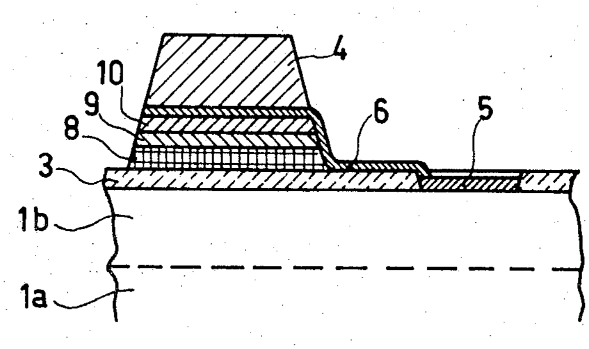
FIG. 4 is an enlarged sectional view of a part of the apparatus.

The process directed to obtaining the vertical gold bars 4 which have a sufficient mechanical resistance and are firmly adherent to the layer of silicon dioxide, as represented in FIG. 4, comprises the following consecutive steps:

(a) A thin layer of nickel-chromium alloy 8 is vacuum deposited in a pattern of vertical strips over which the bars 4 will be formed at the end of the process, (b) Without removing the vacuum, a second thin layer 9 of nickel is deposited over the strips of nickel-chromium alloy, (c) Immediately thereafter, the slab is carried to an electrolytic bath and a thin layer 10 of gold is electrolytically deposited on the said vertical strips, so as to protect the nickel from oxidizing, (d) The nickel chromium bridges 6 are deposited under vacuum to connect the vertical strips and the gold anodes, (e) Thru a second electrolytic operation a relatively thick deposit of gold is grown over the vertical strips, thus completing the formation of the gold bars 4. The thickness of such bars may, for example, be of the order of 20 microns.

Afterward, the layer of oxide on the lower surface of the substrate is removed, and the thin strips 2, of gold, are deposited.

These strips have a width substantially equal to the desired width of the resulting separated semiconductor strips and are separated by intervals substantially equal to the desired distance between the strips. These bars operate as masking means for the substrate during the following etching operation.

The etching is accomplished for example by exposing the surface to a mixture of HF and $HNO_3$ in proper proportion, for a time sufficient to remove all silicon existing in the space between the strips 2, thereby resulting in separate strips of silicon held together only by the vertical gold bars 4.

As a result of such etching operation, limited portions of the gold strips and the gold bars protrude from the silicon chip at the borders thereof, thus providing an easy receptor for soldering said strips and bars to external leads by known means.

Substantially the same process may be used for obtaining diode matrices for other purposes than memory devices, for example, coding and decoding matrices. In particular the process may be used for fabricating diode matrices as part of integrated logical circuits using NOR, Nand, And-Or-Not gates; as, for example, the circuit described in Italian patent application 22,529/66 now Italian Pat. 784,013. The process may conveniently be used in the fabrication of integrated circuits, comprising transistors and other circuit elements, wherein at least a part of the connecting conductors may, in a way easily deducible from the example described, be disposed on the lower face of the substrate, the other conductors being on the upper face.

What is claimed is:

1. An integrated circuit matrix device comprising a plurality of parallel spaced apart semiconductor strips, a first-type conductor affixed to one face of each of said strips and extending along the length thereof, a plurality of like circuit elements spaced apart along the other face of each of said strips, a plurality of elongated parallel spaced apart second-type conductors extending in a direction transverse to the length of said strips, each of said second-type conductors being affixed to said other face of each of said strips, and a conductive link connecting each of said circuit elements to one of said second-type conductors.

2. The matrix of claim 1, wherein each of said circuit elements is a diode comprising a deposited metal layer on said other face.

3. The matrix of claim 2, wherein each of said strips comprises a pair of adjacent semiconductor layers, one layer having a relatively low resistivity and including said one face and the other layer having a relatively high resistivity and including said other face.

4. The matrix of claim 1, wherein each of said second-type conductors is insulated from said other faces by an insulating layer interposed between said second-type conductors and said other faces.

5. The matrix of claim 4 wherein each of said second-type conductors comprises a relatively thin nickel-chromium layer adjacent said insulating layer, a relatively thin nickel layer superposed on said nickel-chromium layer, and a relatively thick gold layer superposed on said nickel layer.

6. The matrix of claim 1, wherein each of said second-type conductors comprises a gold layer having a thickness exceeding 10 microns.

7. The matrix of claim 2, wherein said first-type conductors are affixed in ohmic contact to the corresponding strips.

8. The matrix of claim 1, wherein each of said first-type conductors is coextensive with the area of the corresponding face of said strips.

References Cited

UNITED STATES PATENTS

| | | | |
|---|---|---|---|
| 3,023,347 | 2/1962 | Strull | 156—17(UX) |
| 3,290,753 | 12/1966 | Chang | 29—578(UX) |
| 3,303,400 | 2/1967 | Allison | 317—101A(UX) |
| 3,307,239 | 3/1967 | Lepselter et al. | 156—17X |
| 3,335,338 | 8/1967 | Lepselter | 317—234.22 (UX) |
| 3,362,851 | 1/1968 | Dunster | 317—234-5.3(UX) |
| 3,377,513 | 4/1968 | Ashby et al. | 29—578(UX) |
| 3,381,256 | 4/1968 | Schuller et al. | 317—234-5.3(UX) |
| 3,384,879 | 5/1968 | Stahl et al. | 340—173(UX) |
| 3,409,809 | 11/1968 | Diehl | 317—234-5.3(UX) |
| 3,445,727 | 5/1969 | Maple | 317—101A |

DAVID SMITH, JR., Primary Examiner

U.S. Cl. X.R.

29—578; 117—212; 156—13; 317—234